United States Patent [19]

Rodder

[11] Patent Number: 5,223,736
[45] Date of Patent: Jun. 29, 1993

[54] TRENCH ISOLATION PROCESS WITH REDUCED TOPOGRAPHY

[75] Inventor: Mark S. Rodder, Dallas, Tex.

[73] Assignee: Texas Instruments Incorporated, Dallas, Tex.

[21] Appl. No.: 704,232

[22] Filed: May 22, 1991

Related U.S. Application Data

[62] Division of Ser. No. 413,038, Sep. 27, 1989, Pat. No. 5,106,777.

[51] Int. Cl.[5] ............................................. H01L 27/02
[52] U.S. Cl. ...................................... 257/506; 257/622
[58] Field of Search ............... 357/47, 50, 49; 437/70, 437/72

[56] References Cited

U.S. PATENT DOCUMENTS

| | | | |
|---|---|---|---|
| 4,495,025 | 1/1985 | Haskell | 437/72 |
| 4,502,913 | 3/1985 | Lechaton | 357/47 |
| 4,825,277 | 4/1989 | Mattox et al. | 357/49 |
| 4,839,306 | 6/1989 | Wakamatsu | 357/49 |
| 4,862,240 | 8/1989 | Watanabe | 357/49 |
| 4,903,107 | 2/1990 | Wei | 357/47 |
| 4,924,284 | 5/1990 | Beyer et al. | 357/47 |
| 4,942,137 | 7/1990 | Sivan et al. | 437/72 |
| 4,983,226 | 1/1991 | Hunter et al. | 357/47 |
| 5,017,999 | 5/1991 | Roisen et al. | 357/47 |
| 5,061,653 | 10/1991 | Teng | 357/47 |

Primary Examiner—Rolf Hille
Assistant Examiner—Roy Potter
Attorney, Agent, or Firm—Jacqueline J. Garner; Richard Donaldson; William F. Hiller

[57] ABSTRACT

A structure for and method of forming a trench in a semiconductor body is disclosed herein. A field oxide 16 is grown over a portion of n-well 8 where trench 26 is to be formed. Nitride layer 20 and TEOS oxide layer 22 are deposited. Resist 24 is patterned and TEOS layer 22, nitride layer 20, and field oxide layer 16 are etched. Resist 24 is removed and trench 26 is etched through n-well 8 and into substrate 4. Thin oxide 28 is then grown on the sidewalls of trench 26. Polysilicon is deposited into trench 26 and etched back to form polysilicon plug 30. Sidewall oxide 32, to prevent voids in the topography of trench 26, is formed on top of polysilicon plug 30 along the outer edges of trench 26. To prevent leakage into trench 26, a thick thermal oxide cap 34 is grown over trench 26.

6 Claims, 4 Drawing Sheets

TRENCH ISOLATION PROCESS WITH REDUCED TOPOGRAPHY

This is a division, of application Ser. No. 07/413,038, filed Sep. 27, 1989, now U.S. Pat. No. 5,106,777.

BACKGROUND OF THE INVENTION

1. Field of the Invention

This invention is in the field of integrated circuits, and is specifically directed to the method of forming trench isolation.

2. Description of the Related Art

As the demand for more complex functions and higher performance in integrated circuits increases, it becomes necessary to pack active devices more densely. Density depends upon the area required to isolate transistors from one another as well as upon the active area of transistors. One conventional method of isolation is the well-known local oxidation [LOCOS] technique in which transistors are separated via a locally grown field oxide. According to this technology, the degree of isolation depends on the length and depth of the field oxide separating the transistors. By increasing either the length or the depth of the field oxide, the length of the leakage path between the two active areas is also increased. However, to increase circuit density, the length of the separating field oxide must also be minimized. Increasing the depth of the field oxide has the side effect of encroachment into the active areas of the neighboring transistors. This encroachment results in the deformation phenomenon known as 'birds's beak'.

A second method of isolation, in CMOS processes, uses junction isolation. A P-channel transistor can be isolated from a N-channel transistor by biasing the n-well positive with respect to the p-well, thereby reverse-biasing the junction therebetween. In addition, two N-channel transistors may be isolated from each other by placing a p-well between the two N-channel transistors. There are, however, drawbacks to such junction isolation. One drawback is that additional surface area is required by the junction isolation, causing a less efficient use of space. Another drawback is that junction isolation adds parasitic capacitance to the integrated circuit.

A modern method of isolation uses an isolation trench. An example of an isolation trench is described in U.S. Pat. No. 4,631,803, issued on Dec. 20, 1986 and assigned to Texas Instruments Incorporated. This example uses a sidewall dielectric on the sidewalls of the trench, with a polysilicon plug filling the trench. The trench also has a thin oxide which covers the polysilicon plug. By using a polysilicon plug rather than an oxide filler, stress associated with the formation of an oxide filler as well as stress due to dissimilarities in the coefficients of thermal expansion of the substrate to the filler are reduced. Subsequent processing steps, however, may damage the thin oxide covering the trench causing leakage into the trench. Such leakage can result from, for example, the overetching of contact vias. For this reason contacts made directly over the trench are therefore generally prohibited, resulting in a less efficient use of space and reduced density.

A second example of an isolation trench is described in U.S. Pat. No. 4,835,115, issued May 30, 1989 and also assigned to Texas Instruments Incorporated. This example uses a thick oxide cap grown over a polysilicon plug to allow subsequent metal-to-metal and metal-to-poly contacts to be made directly over the trench. The thick oxide cap minimizes the risk of overetching the contact vias which would otherwise result in leakage from an overlying layer into the trench. Growing a thick oxide can, however, result in the formation of voids in the topology of the trench and surrounding area.

It is therefore an object of this invention to provide a method for fabricating a trench in a semiconductor body which reduces the topography of the trench.

It is further an object of this invention to provide such a method which also allows for contacts to be made directly over the trench.

It is still further an object of this invention to provide such a method which makes efficient use of surface area of the integrated circuit.

It is still further an object of this invention to provide such a method which may be utilized in bipolar, MOS and BiCMOS processes.

Other objects and advantages of this invention will be apparent to those of ordinary skill in the art having reference to the following specification in conjunction with the drawings.

SUMMARY OF THE INVENTION

The invention may be incorporated into a method for forming an isolation region in an integrated circuit. A trench is etched into the semiconductor body at the isolation region and a dielectric layer is then formed over the sides of the trench. A plug is formed in the trench over the dielectric layer, such that the top of the plug is below the top of the trench. On top of the plug, a sidewall dielectric layer is formed on the sides of the trench and a final dielectric is grown over the plug to substantially fill the trench.

DETAILED DESCRIPTION OF THE PREFERRED EMBODIMENT OF THE INVENTION

The trench isolation according to the invention will be described herein as incorporated into a BiCMOS structure. It should of course be understood that the trench isolation according to the invention may be incorporated into integrated circuits which are constructed according to MOS, CMOS, bipolar, or BiCMOS technologies, each of which can utilize the benefits thereof.

In constructing such an integrated circuit it is sometimes necessary to isolate wells from one another. For example, a n-well which will contain MOS transistors must be isolated from a n-well which contains two transistors which must be isolated from each other. N-wells and p-wells can be isolated from each other by reverse-biasing the junction between them. This is known as junction isolation which, for example, isolates two n-wells from each other by placing a p-well between the n-wells. Alternatively, an isolation trench may be formed between two wells or in a well to isolate two portions of the well from one another. Although trench isolation adds to the processing cost, there is an increase in performance over the junction isolation technique due to the reduced parasitic capacitance. In addition, trench isolation requires less surface area and thus allows transistors to be packed more densely than junction isolation.

Figure 1:
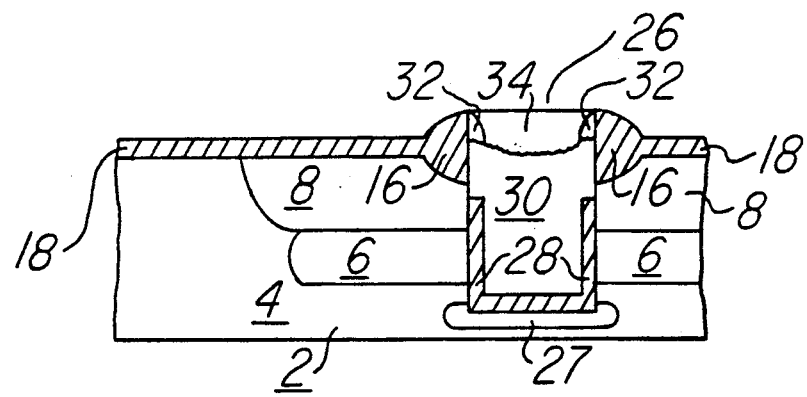
FIG. 1 is a cross-sectional view of a BiCMOS semiconductor structure with trench isolation according to the invention.

The trench isolation structure of the instant embodiment is shown in FIG. 1. Isolation trench 26 is formed in n-well 8, for example to isolate two transistors (not shown), each formed in n-well 8 on opposite sides of trench 26 from one another. In the instant embodiment, a field oxide 16 and dummy gate oxide layer 18 are at the surface of n-well 8. It should be noted, however, that field oxide region 16 is optional and need not be present to practice the instant invention. Trench 26 is within field oxide 16, reaching through n-well 8 into substrate 4. Sidewall oxides 28 are on the vertical edges of the trench.

In the bottom of the trench there is a channel stop region. Above the channel stop region, polysilicon plug 30 fills the trench to a desired depth. On top of polysilicon plug 30, sidewall oxides 32 line the edges of the trench. Sidewall oxides 32 reduce the topography of the trench which would otherwise result from the growth of a thick oxide such as thermal oxide cap 34. Thermal oxide cap 34 is grown such that the top of thermal oxide cap 34 is relatively coplanar with the top of field oxides 16.

Figure 2:
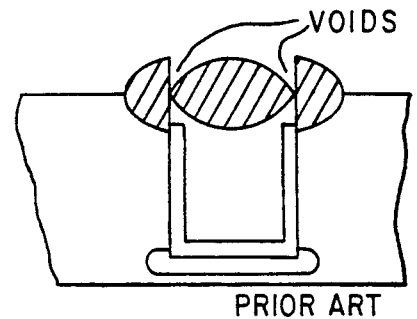
FIG. 2 is a cross-sectional view of a prior art trench isolation.

If sidewall oxides 32 are not in place it has been found that the resultant structure, shown in FIG. 2, can have voids between field oxides 16 and thermal cap 34 because the thermal growth of oxide cap 34 is not uniform in thickness. Thermal oxide cap 34 grows thicker in the middle than on the edges. These voids do not occur when sidewall oxides 32 are in place at the edges of thermal oxide cap 34, so that when polysilicon plug 30 is oxidized, oxide cap 34 is formed without leaving voids in the topology.

Figure 3:
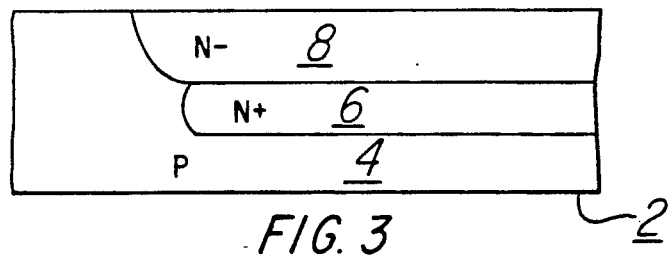
FIGS. 3 through 11 are cross-sectional views of a BiCMOS semiconductor structure illustrating various states of the fabrication of trench isolation according to the invention, into the structure of FIG. 1.

FIG. 3 is a cross-sectional diagram of a semiconductor body 2 having a p-type single crystal silicon substrate 4 after the formation of a buried n+ region 6 and the n-well 8. The formation of an isolation trench in the structure of FIG. 3 will now be described.

Figure 4:
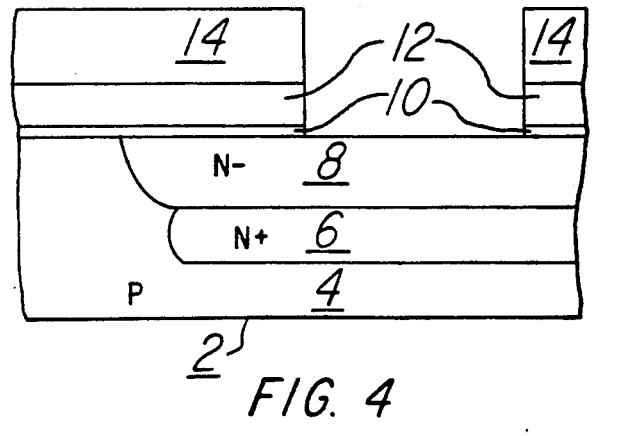

Field oxide region 16 is grown by first forming a mask to prevent oxidation at the location on the semiconductor surface at which transistors are to be found. A nitride layer 14 is used to prevent oxidation, however, depositing nitride directly on the semiconductor surface causes significant stress on substrate 4. Therefore, prior to the deposition of nitride layer 14, a buffer layer 10 of silicon dioxide is grown over the wafer to prevent stress on substrate 4. Silicon dioxide 10 is grown to a thickness on the order of 10 nm. Polysilicon layer 12 is deposited, also prior to the deposition of nitride layer 14, to a thickness on the order of 50 nm over silicon dioxide 10. Finally, the LPCVD nitride layer 14 is deposited to a thickness on the order of 240 nm and the nitride/polysilicon/silicon dioxide combination is patterned and etched to expose the area where field oxide 16 is to be formed, as shown in FIG. 4. During the subsequent field oxide growth, silicon dioxide layer 10, polysilicon layer 12 and nitride layer 14 serve to reduce encroachment into the active areas of the semiconductor body 2. Field oxide 16 is grown in the exposed region according to any one of a number of known techniques for growing field oxide. The preferred method is via a high pressure oxidation (e.g., 52 minutes in a steam environment at 10 atmospheres pressure and 900 degrees Celsius) with nitride layer 14 masking oxidation over the active regions of the structure. The resultant field oxide 16 is preferably at least 700 nm thick. The method of growing field oxide described hereinabove and in U.S. Pat. No. 4,541,167, issued Sep. 17, 1985 and assigned to Texas Instruments Incorporated is preferable, however, as will be apparent to those skilled in the art, alternate methods such as other well-known LOCOS techniques may also be used.

Figure 5:
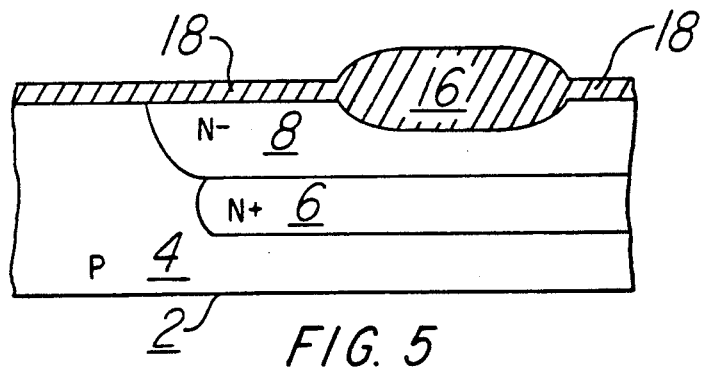

After field oxide 16 is grown, nitride layer 14, polysilicon layer 12, and silicon dioxide layer 10 are etched away to clear the surface of the structure. A dummy gate oxide layer 18, shown in FIG. 5, is then grown to a thickness on the order of 25 nm in order to protect the surface of the structure at which active devices are to be formed during further processing steps.

Figure 6:
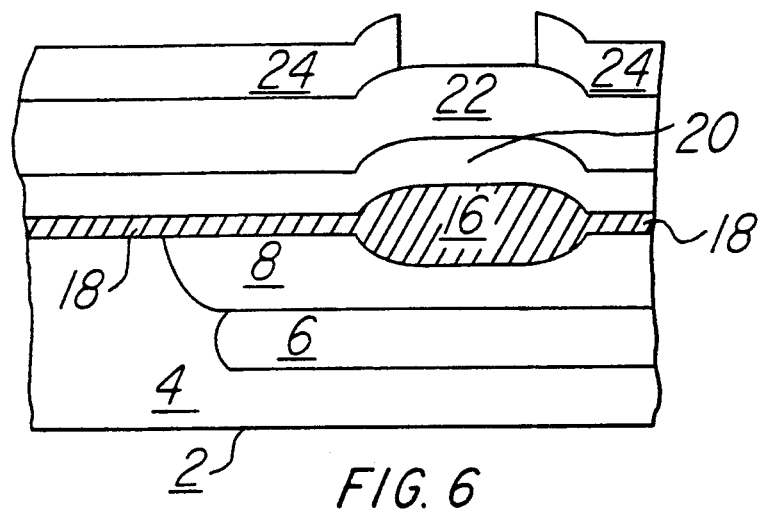

Referring to FIG. 6, LPCVD $Si_3N_4$ layer 20 of thickness on the order of 250 nm is deposited, followed by the deposition of TEOS oxide layer 22 having a thickness on the order of 1 micron. The thickness of these layers is determined by the subsequent trench etch process which utilizes such layers as part of a trench etch mask. The thickness may also contemplate some reduction during the trench etch. This process preferably utilizes these layers as an etch clear detection point. The above thicknesses of layers 20 and 22 contemplate the use of resist etchback planarization.

Figure 7:
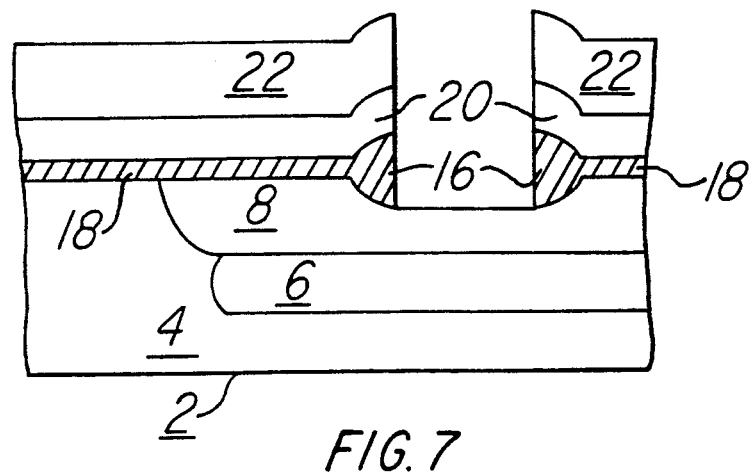
Figure 8:
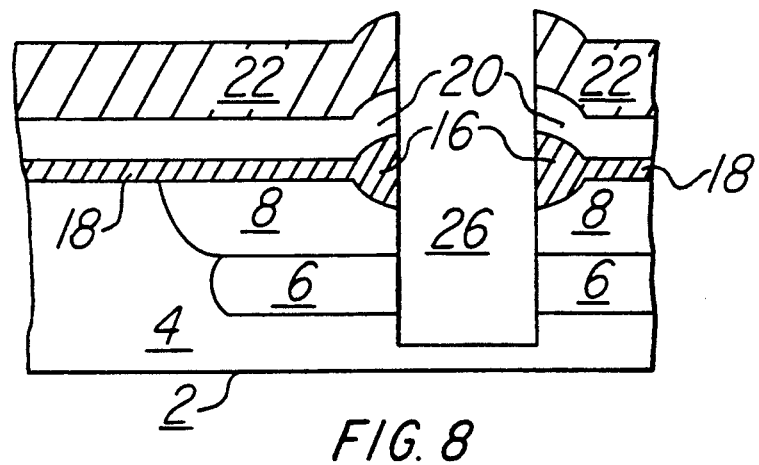

A masking layer 24, such as photoresist, is lithographically patterned as shown in FIG. 6 to expose the area of layer 22 where the trench 26 is to be formed. Now referring to FIG. 7, TEOS layer 22, nitride layer 20, and field oxide layer 16 are etched by conventional techniques to expose a portion of n-well 8. Masking layer 24 is removed and the trench 26 is etched, as shown in FIG. 8, through the n-well 8 and into the substrate 4 by way of a reactive ion etch (RIE), according to well known trench etch techniques, such as described in U.S. Pat. No. 4,690,729, issued on Sep. 1, 1987 and assigned to Texas Instruments Incorporated. Note that part of the TEOS 22 layer and the vertical edges of nitride layer 20 will likely be etched away during the trench etch, although the trench etch is highly selective to nitride and oxide. The reduction of the thickness of TEOS oxide layer 22 depends on the desired depth of trench 26 and the etch selectivity.

Figure 9:
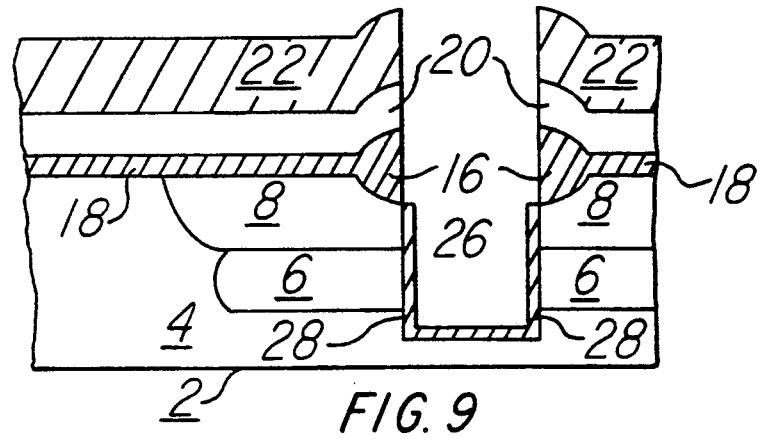

FIG. 9 shows trench sidewall oxide 28 formed via a thermal sidewall oxide growth to a thickness in the range of 25-150 nm together with an optional TEOS deposition thereafter of thickness on the order of 100 nm. The optional TEOS oxide may be used as part of the etch clear detection point during the subsequent poly planarization step.

Next, polysilicon plug 30 and channel stop 27 are formed. A thin layer of polysilicon is then deposited to a thickness on the order of 100 nm and channel stop 27 is implanted (e.g., 7E13 Boron/$cm^2$ at 65 KEV) through the polysilicon layer at the bottom of the trench. Alternative methods for forming the channel stop, such as forming a dummy oxide layer in the trench, implanting the channel stop through the oxide and removing the dummy oxide prior to the step of forming sidewall oxides 28 will be apparent to those skilled in the art.

Figure 10:
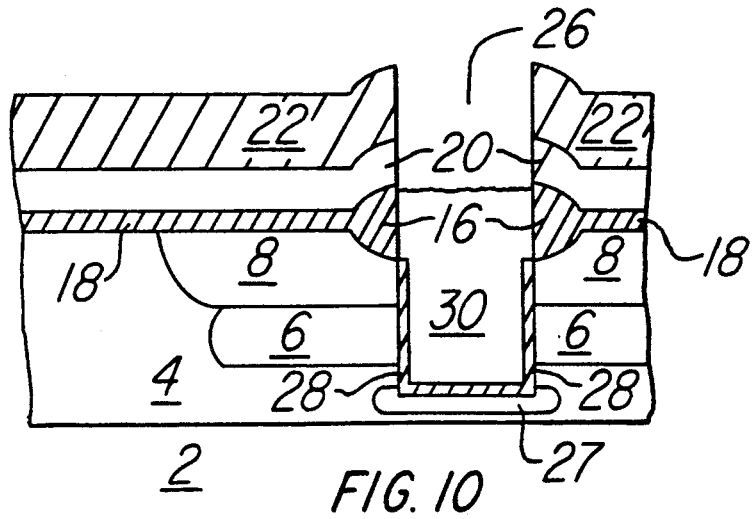

After the channel stop implant, more polysilicon is deposited to form a total polysilicon thickness, including both the polysilicon deposited before and after the channel stop, on the order of 700 nm to 2000 nm. The polysilicon is subsequently etched back until the top of the polysilicon in the trench, polysilicon plug 30, is relatively coplanar with the top of field oxides 16, as shown in FIG. 10. The depth below the top of the trench to which the plug is etched back to depends on the desired thickness of thermal oxide cap 34. The plug must be etched back far enough to allow the top of oxide cap 34 be close to the top of field oxide 16 after oxidation. Polysilicon plug 30 has the benefit over the conventional oxide fill, as it adds minimal stress to the integrated circuit since polysilicon and single crystal silicon expand and contract at substantially the same rate during the temperature cycling which occurs during subsequent processing steps. It will be apparent to those skilled in the art that alternative materials, such as amorphous silicon or epitaxially grown silicon, may also be used to form plug 30. In addition, polysilicon plug 30 may optionally be doped in-situ (e.g., 1E19 to 1E20 phosphorous/$cm^3$), before deposition, or implant doped after etch back (e.g., 1E15 to 1E16 phosphorous/$cm^2$), so that a thick oxide may be grown in a short time taking advantage of the enhanced oxidation rate of heavily doped n-type silicon. Alternative methods using n-type dopants such as arsenic may also be used.

Figure 11:
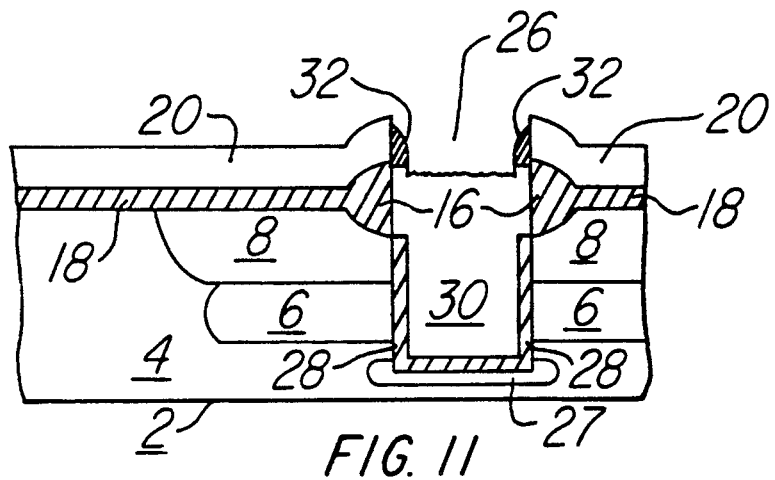

Sidewall oxides 32, shown in FIG. 11 are formed along the outer edges of trench region 26 to eliminate voids between the field oxides 16 and the subsequently grown thermal oxide cap 34 which can occur in the remaining processing steps of the trench formation. An optional etch may be performed at this time to remove TEOS layer 22. To form sidewall oxides 32, a layer of TEOS oxide is deposited of thickness 1500Å–3500Å. This TEOS layer plus the initial TEOS layer 22, if it has not already been removed, is then anisotropically etched back, using nitride layer 20 as an endpoint detection layer to form sidewall oxide 32 along the vertical edges of nitride layer 20 and field oxide 16 within trench 26.

A thick thermal oxide cap 34 is then thermally grown over the trench structure such that the height of thermal oxide cap 34 is slightly higher than the top of the etched-through field oxide region 16. The thick oxide cap 34 allows for subsequent metal-to-poly contacts to be made directly above the trench 26 because it minimizes the risk of contact etch damage creating an electrical connection to the polysilicon plug 30.

Figure 12A:
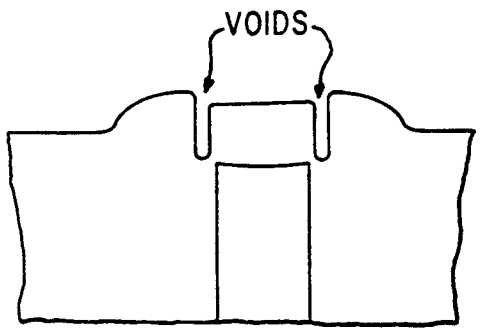
FIG. 12a is a drawing of a SEM photograph of a BiCMOS structure with a prior art trench isolation.
Figure 12B:
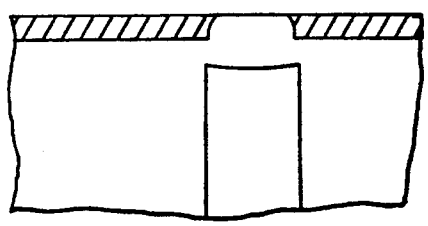
FIG. 12b is a drawing of a SEM photograph of a BiCMOS structure with trench isolation according to the invention.

Finally, nitride layer 20 is stripped off using conventional wet etch techniques. The resultant structure is shown in FIG. 1. Note that the traditional problem, shown in the drawing of a SEM cross-section of FIG. 12a, of voids between the field oxide and the thermal cap, due to the non-uniform thickness of the thermal oxide growth, is eliminated with the formation of sidewall oxides 32, as shown in FIG. 12b. Sidewall oxides 32 are formed on the edges of the trench which is also where the edges of the thermal oxide cap will be. When the polysilicon is oxidized, oxide cap 34 will still grow thicker in the middle of the trench, but sidewall oxides 32 make up the difference in thickness along the edges.

Subsequent to the completion of the method described hereinabove, transistors and other elements, as well as connections therebetween, are formed into n-well 4. An example of such structures and a method for their formation is described in copending application Ser. No. 129,261 filed Dec. 7, 1987 and assigned to Texas Instruments Incorporated. Individual circuits are then separated from portions of substrate 4 and external connections made thereto by way of wire bonding, direct bump connection, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments Incorporated.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations on the implant conditions and oxidation cycles described herein. It is contemplated that all such changes and additional embodiments are within the spirit and true scope of the invention as claimed below.

I claim:

1. An isolation trench in an integrated circuit comprising:
   (a) a semiconductor body having a trench of a first depth;
   (b) a first dielectric layer on the vertical edges of said trench;
   (c) a plug within said trench, said plug filling said trench to a predetermined depth below the top of said trench;
   (d) a second dielectric layer on the vertical edges of and within said trench above said plug; and
   (e) a thermal oxide layer within said trench above said plug which substantially fills said trench.

2. The isolation trench of claim 1, wherein said plug comprises polycrystalline silicon.

3. The isolation trench of claim 1, wherein said first dielectric layer comprises:
   (a) a layer of thermal oxide; and
   (b) a layer of TEOS oxide.

4. The isolation trench of claim 1 further comprising:
   (a) a doped region of said semiconductor body located at the bottom of said trench.

5. The isolation trench of claim 1, further comprising:
   (a) a well region of a second depth, said second depth less than said first depth, in said semiconductor body, said well region adjacent to a first and second side of said trench.

6. The isolation trench of claim 1, further comprising:
   (a) a field oxide region at a first portion of the surface of said semiconductor body, said field oxide region surrounding said trench.

* * * * *